(12) United States Patent
Hasegawa

(10) Patent No.: US 7,205,800 B2
(45) Date of Patent: Apr. 17, 2007

(54) CLOCK FREQUENCY DIVIDER CIRCUIT

(75) Inventor: Koichi Hasegawa, Kanagawa (JP)

(73) Assignee: Sony Corporation (JP)

( * ) Notice: Subject to any disclaimer, the term of this patent is extended or adjusted under 35 U.S.C. 154(b) by 23 days.

(21) Appl. No.: 11/274,256

(22) Filed: Nov. 16, 2005

(65) Prior Publication Data

US 2006/0109035 A1   May 25, 2006

(30) Foreign Application Priority Data

Nov. 24, 2004   (JP) .......................... P2004-339353

(51) Int. Cl.
*H03K 21/00* (2006.01)
*H03K 23/00* (2006.01)
*H03K 25/00* (2006.01)

(52) U.S. Cl. .................... 327/115; 327/117; 377/47

(58) Field of Classification Search ................ 327/115, 327/117–118; 377/47–48
See application file for complete search history.

(56) References Cited

U.S. PATENT DOCUMENTS

| 4,462,110 | A * | 7/1984 | Baldwin et al. | ............... | 377/43 |
| 6,445,232 | B1 * | 9/2002 | Logue et al. | ................ | 327/158 |
| 6,459,309 | B2 * | 10/2002 | Canard et al. | ............... | 327/115 |
| 6,618,462 | B1 * | 9/2003 | Ross et al. | ..................... | 377/48 |

FOREIGN PATENT DOCUMENTS

JP   2001-127618   5/2001

OTHER PUBLICATIONS

Riley, T.A.D., Copeland, M.A., Kwasniewski, T.A.; "Delta-Sigma Modulation in Fractional-N Frequency Synthsis," May 1993, IEEE Journal of Solid-State Circuits, vol. 28, Issue 5, pp. 553-559.*

* cited by examiner

*Primary Examiner*—Timothy P. Callahan
*Assistant Examiner*—Diana Cheng
(74) *Attorney, Agent, or Firm*—Rader, Fishman & Grauer PLLC; Ronald P. Kananen

(57) ABSTRACT

A clock frequency divider circuit including: a storing section for storing an input signal in synchronism with an input clock signal; a supplying section for supplying, as the input signal, one of a first value obtained by adding a value stored by the storing section to a numerator setting value and a second value obtained by subtracting a denominator setting value from the first value; a retaining section for retaining a most significant bit of the value stored by the storing section in synchronism with the input clock signal; and a logical product generating section for generating a logical product of a value retained by the retaining section and the input clock signal, and outputting the logical product as an output clock signal; wherein the supplying section supplies one of the first value and the second value as the input signal on a basis of the most significant bit of the value stored by the storing section.

10 Claims, 4 Drawing Sheets

CLOCK FREQUENCY DIVIDER CIRCUIT

CROSS REFERENCES TO RELATED APPLICATIONS

The present invention contains subject matter related to Japanese Patent Application JP 2004-339353 filed in Japanese Patent Office on Nov. 24, 2004, the entire contents of which are incorporated herein by reference.

BACKGROUND OF THE INVENTION

The present invention relates to a clock frequency divider circuit and, particularly, to a clock frequency divider circuit that divides the frequency of an input clock signal and generates a clock signal with an arbitrary frequency dividing ratio.

Conventionally, each element in a semiconductor integrated circuit is controlled with a clock signal as a basis, and the operating speed of each element is determined by the clock signal. A quartz oscillator is generally used as an oscillating source for generating a clock signal supplied to a semiconductor integrated circuit, because of the stability and accuracy of the quartz oscillator.

Since clock signals of various frequencies are required in a semiconductor integrated circuit, a signal resulting from 1/D (D is a natural number) division of the frequency of a clock signal may be used. Such division of the frequency of a clock signal can be easily performed by using a scale-of-D counter.

On the other hand, as prior art, a clock signal generating circuit is proposed in which a m-bit adder, storing means for storing data preceding by one clock, and a m-bit, D-type flip-flop circuit are used, external input data having a value n is inputted to one input terminal of the adder, and an output of the adder is connected to one input terminal of the D-type flip-flop circuit. In the prior art, a system clock is inputted to another input terminal of the D-type flip-flop circuit, an output of the D-type flip-flop circuit is connected to another input terminal of the adder, and the most significant bit of the output signal of the D-type flip-flop circuit is outputted as a clock signal (see Japanese Patent Laid-open No. 2001-127618(FIG. 1), for example).

Letting n be the value of the external input data and m be the number of bits of the adder and the D-type flip-flop circuit, the frequency dividing ratio DR1 of the clock signal generating circuit is $DR1 = 2^m/n \text{(where } 2^m > n\text{)}$

SUMMARY OF THE INVENTION

However, a conventional frequency divider circuit using a scale-of-D counter has a disadvantage of being able to perform only 1/D (D is a natural number) frequency division. Therefore, a large number of quartz oscillators or the like needs to be provided as an oscillating source to generate clocks of various frequencies.

In addition, the clock signal generating circuit according to Patent Literature 1 has a problem in that the number of bits of the adder and the D-type flip-flop circuit limits the frequency dividing ratio of the clock signal generating circuit to the frequency dividing ratio expressed by the above equation.

Accordingly, it is desirable to make it possible to divide the frequency of a clock signal with an arbitrary frequency dividing ratio and obtain a clock signal of a desired frequency.

According to a first embodiment of the present invention, there is provided a clock frequency divider circuit. The clock frequency divider circuit includes storing means for storing an input signal in synchronism with an input clock signal; supplying means for supplying, as the input signal, one of a first value obtained by adding a value stored by the storing means to a numerator setting value and a second value obtained by subtracting a denominator setting value from the first value; retaining means for retaining a most significant bit of the value stored by the storing means in synchronism with the input clock signal; and logical product generating means for generating a logical product of a value retained by the retaining means and the input clock signal, and outputting the logical product as an output clock signal. The supplying means supplies one of the first value and the second value as the input signal on a basis of the most significant bit of the value stored by the storing means. It is thereby possible to divide the frequency of an input clock signal with an arbitrary frequency dividing ratio and obtain an output clock signal of a desired frequency.

In the first embodiment, an initial value of the storing means can be a value obtained by subtracting one from a value obtained by raising two to a power of a number corresponding to a minimum integral value not smaller than a result obtained by dividing a logarithm of the denominator setting value by a logarithm of two.

According to a second embodiment of the present invention, there is provided a clock frequency divider circuit for dividing a frequency of a predetermined input clock signal with a frequency dividing ratio obtained by dividing a numerator setting value by a denominator setting value. The clock frequency divider circuit includes adding means for adding a previous result of addition to one of a difference between the numerator setting value and the denominator setting value and the numerator setting value; storing means for storing a result of addition by the adding means in synchronism with the input clock signal, and supplying the stored result of addition as the previous result of addition to the adding means; retaining means for retaining a most significant bit of the result of addition stored by the storing means in synchronism with the input clock signal; and logical product generating means for generating a logical product of the most significant bit of the result of addition retained by the retaining means and the input clock signal, and outputting the logical product as an output clock signal. In an initial stage in which the result of addition is not obtained, the storing means supplies a predetermined initial value as the previous result of addition to the adding means. The adding means selects one of the difference between the numerator setting value and the denominator setting value and the numerator setting value on a basis of a value of the most significant bit of the previous result of addition, adds the previous result of addition to a result of the selection, and supplies a result of the addition to the storing means. It is thereby possible to divide the frequency of an input clock signal with an arbitrary frequency dividing ratio and obtain an output clock signal of a desired frequency.

In the second embodiment, the initial value can be a value obtained by subtracting one from a result obtained by raising two to a power of a number corresponding to a minimum integral value not smaller than a result obtained by dividing a logarithm of the denominator setting value by a logarithm of two.

According to a third embodiment of the present invention, there is provided a clock frequency divider circuit for dividing a frequency of a predetermined input clock signal with a frequency dividing ratio obtained by dividing a numerator setting value by a denominator setting value. The clock frequency divider circuit includes a subtracter for performing a predetermined subtraction process; a register for storing a first output value from the subtracter in synchronism with the input clock signal, and outputting a second output value corresponding to the first output value in synchronism with the input clock signal; a selector for selecting one of the denominator setting value and a value "0" according to a third output value corresponding to a value of a most significant digit when the second output value from the register is represented in binary notation, and outputting a result of the selection as a fourth output value; an adder for adding the numerator setting value to the second output value outputted from the register, and outputting a fifth output value corresponding to a result of the addition; a latch for retaining the third output value corresponding to the value of the most significant digit of the second output value outputted from the register in synchronism with the clock signal; and a logical product circuit for calculating a logical product of a sixth output value outputted from the latch and the clock signal, and outputting a result of the calculation as an output clock signal. The subtracter subtracts the fourth output value outputted from the selector from the fifth output value outputted from the adder and outputs the first output value corresponding to the result of the subtraction. It is thereby possible to divide the frequency of an input clock signal with an arbitrary frequency dividing ratio and obtain an output clock signal of a desired frequency.

In the third embodiment, an initial value of the register can be a value obtained by subtracting one from a result obtained by raising two to a power of a number corresponding to a minimum integral value not smaller than a result obtained by dividing a logarithm of the denominator setting value by a logarithm of two.

According to a fourth embodiment of the present invention, there is provided a clock frequency divider circuit for dividing a frequency of a predetermined input clock signal with a frequency dividing ratio obtained by dividing a numerator setting value by a denominator setting value. The clock frequency divider circuit includes: an adder for performing a predetermined addition process; a register for storing a first output value from the adder in synchronism with the input clock signal, and outputting a second output value corresponding to the first output value in synchronism with the input clock signal; a selector for selecting one of the numerator setting value and a value corresponding to a result of subtraction of the denominator setting value from the numerator setting value according to a third output value corresponding to a value of a most significant digit when the second output value from the register is represented in binary notation, and outputting a result of the selection as a fourth output value; a latch for retaining the third output value corresponding to the value of the most significant digit of the second output value outputted from the register in synchronism with the clock signal; and a logical product circuit for calculating a logical product of a sixth output value outputted from the latch and the clock signal, and outputting a result of the calculation as an output clock signal. The adder adds the fourth output value outputted from the selector to the second output value outputted from the register and outputs the first output value corresponding to a result of the addition. It is thereby possible to divide the frequency of an input clock signal with an arbitrary frequency dividing ratio and obtain an output clock signal of a desired frequency.

In the fourth embodiment, an initial value of the register can be a value obtained by subtracting one from a result obtained by raising two to a power of a number corresponding to a minimum integral value not smaller than a result obtained by dividing a logarithm of the denominator setting value by a logarithm of two.

The present invention can produce the excellent effect of making it possible to divide the frequency of a clock signal with an arbitrary frequency dividing ratio and generate a clock signal of an arbitrary frequency.

DETAILED DESCRIPTION OF PREFERRED EMBODIMENTS

Preferred embodiments of the present invention will be described next in detail with reference to the drawings.

Figure 1:
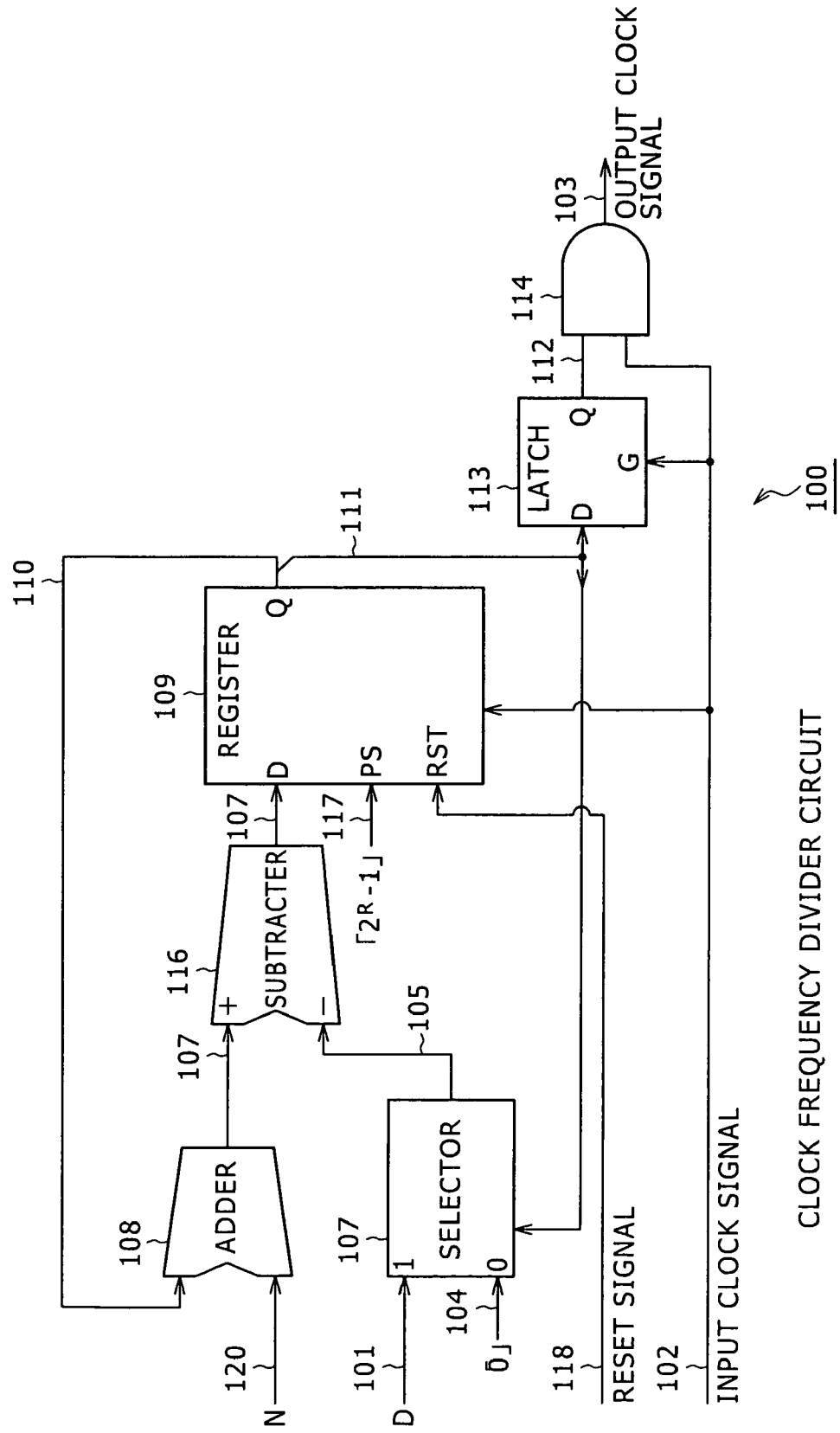
FIG. 1 is a diagram showing an example of a configuration of a clock frequency divider circuit 100 according to a first embodiment of the present invention.

FIG. 1 is a diagram showing an example of a configuration of a clock frequency divider circuit 100 according to a first embodiment of the present invention. This clock frequency divider circuit 100 subjects an input clock signal 102 to N/D frequency division, where N is a numerator setting value of a frequency dividing ratio (N/D), and D is a denominator setting value of the frequency dividing ratio. However, it is assumed that the numerator setting value N and the denominator setting value D of the frequency dividing ratio are each an arbitrary natural number, and each satisfy a condition (N≦D) and a condition (D!=0).

The clock frequency divider circuit 100 includes a selector 107, an adder 108, a subtracter 116, a register 109, a latch 113, and a logical product circuit 114.

The selector 107 is supplied with an input signal 101 corresponding to the denominator setting value D of the frequency dividing ratio, an input signal 104 corresponding to a value "0," and an output signal 111 corresponding to the most significant bit of an output signal (register output) 110 from the register 109. The selector 107 outputs one of the input signal 101 and the input signal 104 as an output signal (selector output) 105 according to the value of the output signal 111.

Specifically, when the value of the output signal 111 representing the most significant bit of the register output 110 is "1," the selector 107 selects the input signal 101 corresponding to the denominator setting value D of the frequency dividing ratio and outputs the input signal 101 as the selector output 105. On the other hand, when the value of the output signal 111 is "0," the selector 107 selects the input signal 104 and outputs the input signal 104 as the selector output 105.

The adder 108 is supplied with an input signal 120 corresponding to the numerator setting value N of the frequency dividing ratio and the output signal (register output) 110 from the register 109. The adder 108 outputs an output signal 115 corresponding to the result of addition.

The subtracter 116 is supplied with the output signal 115 from the adder 108 and the output signal 105 from the selector 107. The subtracter 116 outputs an output signal 106 corresponding to a value obtained by subtracting a value corresponding to the output signal 105 from a value corresponding to the output signal 115.

The register 109 is supplied with the output signal 106 from the subtracter 116, an input signal 117 corresponding to a predetermined initial value "$2^R-1$" (where the variable R represents a value obtained by Equation (1) to be described later), a reset signal 118, and an input clock signal 102. The register 109 outputs the output signal 110. The most significant bit of the output signal 110 is outputted as the output signal 111.

Specifically, the initial value "$2^R-1$" represented by the input signal 117 is set in the register 109 in response to the reset signal 118. The output signal 106 outputted from the subtracter 116 is inputted to the register 109 in synchronism with the input clock signal 102. The register 109 stores a result of subtraction corresponding to the output signal 106.

The latch 113 is supplied with the output signal 111 corresponding to the most significant bit of the register output 110 from the register 109 from a D terminal, and it is supplied with the input clock signal 102 from a G terminal. The latch 113 passes the output signal 111 inputted from the D terminal while the value of the input clock signal 102 is "0". That is, the latch 113 outputs a gate signal (latch output signal) 112 corresponding to a value retained at a present time.

While the value of the input clock signal 102 is "1," on the other hand, the latch 113 retains the output signal 111 from the D terminal input when the value of the input clock signal 102 is changed from "0" to "1" and outputs the output signal 111.

The logical product circuit 114 is supplied with the latch output signal 112 outputted from the latch 113 and the input clock signal 102. The logical product circuit 114 obtains a logical product (AND) of the latch output signal 112 and the input clock signal 102 and generates and outputs an output clock signal 103 corresponding to the result.

First, the bit width of each part is set on the basis of the value of the variable R calculated from the following Equation (1).

$$R = ceil(\log(D)/\log(2)) \quad \text{Equation (1)}$$

where the variable D is a representable minimum bit width ceil is a function that returns a minimum integral value not smaller than an argument, and log is a function that returns a natural logarithm.

Thus, from the above Equation (1), the adder 108 in FIG. 1 is formed with a bit width of (R+1) bits. The subtracter 116 is formed with a bit width of (R+1) bits. The selector 107 is formed with a bit width of R. The register 109 is formed with a bit width of (R+1) bits.

The input signal 120 corresponding to the numerator setting value N of the frequency dividing ratio in FIG. 1 is formed with a bit width of R. The input signal 101 corresponding to the denominator setting value D of the frequency dividing ratio is formed with a bit width of R. The output signal 115 corresponding to the result of addition of the adder 108 is formed with a bit width of (R+1) bits.

The output signal 106 corresponding to the result of subtraction of the subtracter 116 is formed with a bit width of (R+1) bits. The output signal (selector output) 105 of the selector 107 is formed with a bit width of R. The register output 110 is formed with a bit width of (R+1) bits. The output signal 111 representing the most significant bit of the register output is formed with a bit width of 1 bit.

Figure 2:
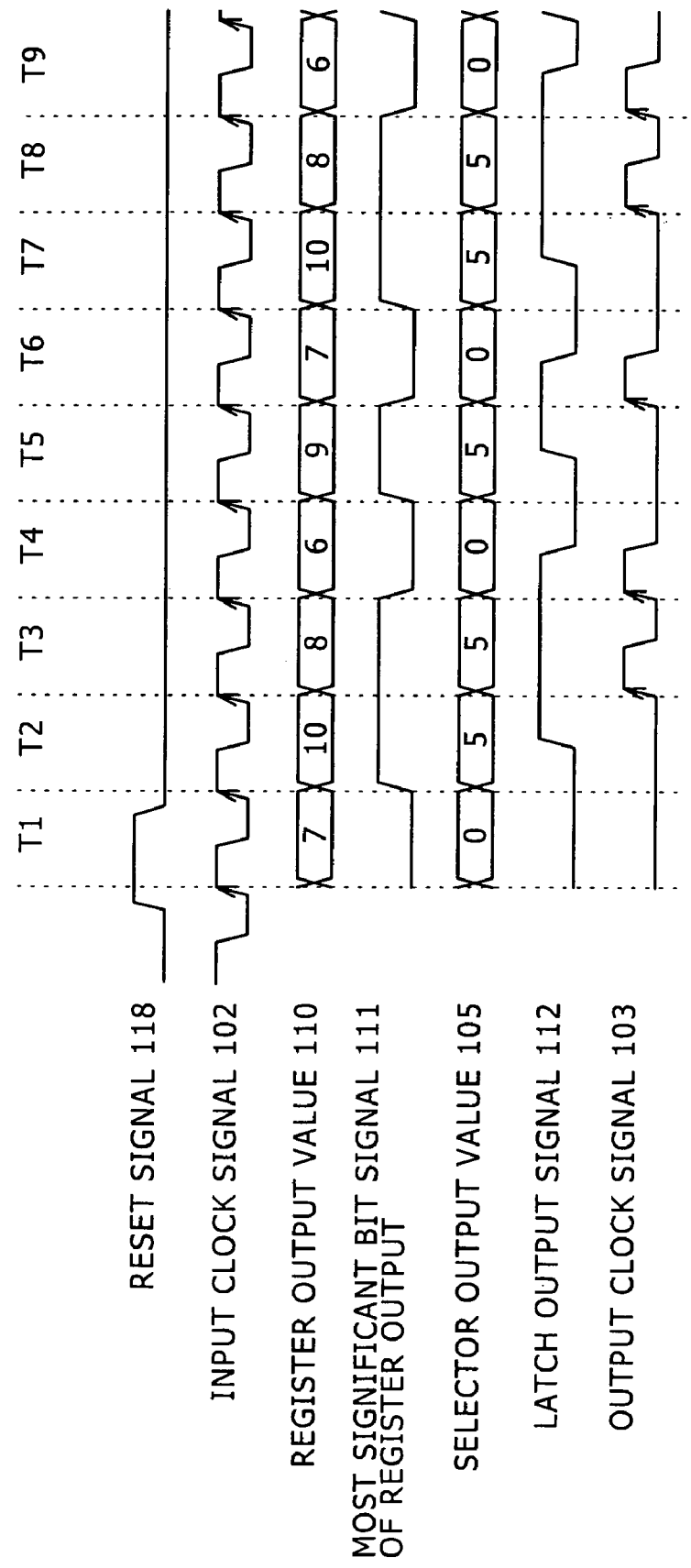
FIG. 2 is a timing chart of an operation of the clock frequency divider circuit 100 according to the first embodiment of the present invention.

The operation of the clock frequency divider circuit 100 according to the first embodiment of the present invention will be described concretely next with reference to FIG. 1 and FIG. 2. FIG. 2 is a timing chart showing an operation when it is assumed that N=3 and D=5, and N/D (=3/5) frequency division is performed in the clock frequency divider circuit of FIG. 1. Suppose in the following that a period from a rising edge of the input clock signal 102 to a next rising edge of the input clock signal 102 is one cycle, and that cycles are described as T1, T2, T3, . . . . In this case, from the above Equation (1), R is 3 (=ceil(log(5)/log(2)).

First, when the reset signal 118 is set to a high level, an initial value "7" (=$2^R-1$) is set in the register 109 by the input signal 117. In this case, from the above Equation (1), R is 3.

Next, in a cycle T1 from a rising edge of the input clock signal 102 to the next rising edge of the input clock signal 102, the register 109 outputs the register output 110 corresponding to the initial value "7" (="0111" (binary notation)). At this time, the value corresponding to the output signal 111 representing the most significant bit of the register output 110 is "0."

The output signal 111 is outputted to the data (D) terminal of the latch 113. The latch 113 retains the value "0" of the output signal 111 inputted from the D terminal when the value of the input clock signal 102 is changed to "1" and outputs the latch output signal 112 corresponding to the value "0".

Specifically, the latch 113 captures and retains the value "0" of the output signal 111 when the input clock signal 102 rises and outputs the retained value "0" as the latch output signal 112 while the value of the input clock signal 102 is "1". While the value of the input clock signal 102 is "0", the latch 113 outputs the value "0" of the output signal 111 inputted from the D terminal as it is as the latch output signal 112.

The adder 108 adds the value "7" of the output 110 of the register 109 to the value "3" of the input signal 120 representing the numerator setting value N of the frequency dividing ratio. The adder 108 outputs the output signal 115 representing a value "10" (="1010" (binary notation)) as a result of the addition.

The selector 107 selects the input signal 104 because the value of the output signal 111 representing the most significant bit of the register output 110 is "0" when the input clock signal 102 rises in cycle T1. The selector 107 outputs the input signal 104 as the selector output 105. That is, the selector 107 outputs the selector output 105 corresponding to the value "0" of the input signal 104.

The subtracter 116 subtracts the value "0" of the output signal 105 of the selector 107 from the value "10" of the output signal 115 of the adder 108 and outputs the output signal 106 corresponding to the value "10" as a result of the subtraction.

In a next cycle T2, the register 109 stores the value "10" of the output signal 106 from the subtracter 116 and outputs the register output 110 corresponding to the value "10". At this time, the value corresponding to the output signal 111 representing the most significant bit of the register output 110 is "1".

The output signal 111 is outputted to the D terminal of the latch 113. Since the value of the output signal 111 when the input clock signal 102 rises in cycle T2 is "0", the latch 113 retains the value "0" of the output signal 111 inputted from the D terminal. The latch 113 outputs the latch output signal 112 corresponding to the value "0" while the value of the input clock signal 102 is "1".

While the value of the input clock signal 102 is "0" in cycle T2, the value of the output signal 111 is "1". Therefore, while the value of the input clock signal 102 is "0", the latch 113 passes the output signal 111, so that the value of the latch output signal 112 is "1".

The adder 108 adds the value "10" of the register output 110 from the register 109 to the value "3" of the input signal 120 corresponding to the numerator setting value N of the frequency dividing ratio. The adder 108 outputs the output signal 115 corresponding to a value "13" as a result of the addition.

The selector 107 selects the value "5" of the input signal 101 representing the denominator setting value D of the frequency dividing ratio because the value of the output signal 111 representing the most significant bit of the register output 110 is "1". The selector 107 outputs the selector output 105 corresponding to the value "5".

The subtracter 116 subtracts the value "5" of the output signal 105 of the selector 107 from the value "13" of the output signal 115 of the adder 108 and outputs the output signal 106 corresponding to a value "8" (="1000" (binary notation)) as a result of the subtraction.

In a next cycle T3, the register 109 stores the value "8" of the output signal 106 from the subtracter 116 and outputs the register output 110 corresponding to the value "8". At this time, the value corresponding to the output signal 111 representing the most significant bit of the register output 110 is "1".

The output signal 111 is outputted to the D terminal of the latch 113. Since the value of the output signal 111 when the input clock signal 102 rises in cycle T3 is "1", the latch 113 retains the value "1" of the output signal 111 inputted from the D terminal. The latch 113 outputs the latch output signal 112 corresponding to the value "1" while the value of the input clock signal 102 is "1".

While the value of the input clock signal 102 is "0" in cycle T3, the value of the output signal 111 is "1". Therefore, while the value of the input clock signal 102 is "0", the latch 113 passes the output signal 111, so that the value of the latch output signal 112 is "1".

The adder 108 adds the value "8" of the register output 110 from the register 109 to the value "3" of the input signal 120 corresponding to the numerator setting value N of the frequency dividing ratio. The adder 108 outputs the output signal 115 corresponding to a value "11" as a result of the addition.

The selector 107 selects the value "5" of the input signal 101 representing the denominator setting value D of the frequency dividing ratio because the value of the output signal 111 representing the most significant bit of the register output 110 is "1". The selector 107 outputs the selector output 105 corresponding to the value "5".

The subtracter 116 subtracts the value "5" of the output signal 105 of the selector 107 from the value "11" of the output signal 115 of the adder 108 and outputs the output signal 106 corresponding to the value "6" (="0110" (binary notation)) as a result of the subtraction.

In a next cycle T4, the register 109 stores the value "6" of the output signal 106 from the subtracter 116 and outputs the register output 110 corresponding to the value "6". At this time, the value corresponding to the output signal 111 representing the most significant bit of the register output 110 is "0".

The output signal 111 is outputted to the D terminal of the latch 113. Since the value of the output signal 111 when the input clock signal 102 rises in cycle T4 is "1", the latch 113 retains the value "1" of the output signal 111 inputted from the D terminal. The latch 113 outputs the latch output signal 112 corresponding to the value "1" while the value of the input clock signal 102 is "1".

While the value of the input clock signal 102 is "0" in cycle T4, the value of the output signal 111 is "0". Therefore, while the value of the input clock signal 102 is "0", the latch 113 passes the output signal 111, so that the value of the latch output signal 112 is "0".

The adder 108 adds the value "6" of the register output 110 from the register 109 to the value "3" of the input signal 120 corresponding to the numerator setting value N of the frequency dividing ratio. The adder 108 outputs the output signal 115 corresponding to a value "9" as a result of the addition.

The selector 107 selects the value "0" of the input signal 104 because the value of the output signal 111 representing the most significant bit of the register output 110 is "0". The selector 107 outputs the selector output 105 corresponding to the value "0".

The subtracter 116 subtracts the value "0" of the output signal 105 of the selector 107 from the value "9" of the output signal 115 of the adder 108 and outputs the output signal 106 corresponding to a value "9" (="1001" (binary notation)) as a result of the subtraction.

In a next cycle T5, the register 109 stores the value "9" of the output signal 106 from the subtracter 116 and outputs the register output 110 corresponding to the value "9". At this time, the value corresponding to the output signal 111 representing the most significant bit of the register output 110 is "1".

The output signal 111 is outputted to the D terminal of the latch 113. Since the value of the output signal 111 when the input clock signal 102 rises in cycle T5 is "0", the latch 113 retains the value "0" of the output signal 111 inputted from the D terminal. The latch 113 outputs the latch output signal 112 corresponding to the value "0" while the value of the input clock signal 102 is "1".

While the value of the input clock signal 102 is "0" in cycle T5, the value of the output signal 111 is "1". Therefore, while the value of the input clock signal 102 is "0," the latch 113 passes the output signal 111, so that the value of the latch output signal 112 is "1."

The adder 108 adds the value "9" of the register output 110 from the register 109 to the value "3" of the input signal 120 corresponding to the numerator setting value N of the frequency dividing ratio. The adder 108 outputs the output signal 115 corresponding to a value "12" as a result of the addition.

The selector 107 selects the value "5" of the input signal 101 representing the denominator setting value D of the frequency dividing ratio because the value of the output signal 111 representing the most significant bit of the register output 110 is "1". The selector 107 outputs the selector output 105 corresponding to the value "5".

The subtracter 116 subtracts the value "5" of the output signal 105 of the selector 107 from the value "12" of the output signal 115 of the adder 108 and outputs the output signal 106 corresponding to the value "7" (="0111" (binary notation)) as a result of the subtraction.

In a next cycle T6, the register 109 stores the value "7" of the output signal 106 from the subtracter 116 and outputs the register output 110 corresponding to the value "7". At this time, the value corresponding to the output signal 111 representing the most significant bit of the register output 110 is "0".

The output signal 111 is outputted to the D terminal of the latch 113. Since the value of the output signal 111 when the input clock signal 102 rises in cycle T6 is "1", the latch 113 retains the value "1" of the output signal 111 inputted from the D terminal. The latch 113 outputs the latch output signal 112 corresponding to the value "1" while the value of the input clock signal 102 is "1".

While the value of the input clock signal 102 is "0" in cycle T6, the value of the output signal 111 is "0". Therefore, while the value of the input clock signal 102 is "0," the latch 113 passes the output signal 111, so that the value of the latch output signal 112 is "0".

The adder 108 adds the value "7" of the register output 110 from the register 109 to the value "3" of the input signal 120 corresponding to the numerator setting value N of the frequency dividing ratio. The adder 108 outputs the output signal 115 corresponding to a value "10" as a result of the addition.

The selector 107 selects the value "0" of the input signal 104 because the value of the output signal 111 representing the most significant bit of the register output 110 is "0". The selector 107 outputs the selector output 105 corresponding to the value "0".

The subtracter 116 subtracts the value "0" of the output signal 105 of the selector 107 from the value "10" of the output signal 115 of the adder 108 and outputs the output signal 106 corresponding to a value "10" (="1010" (binary notation)) as a result of the subtraction.

In a next cycle T7, the register 109 stores the value "10" of the output signal 106 from the subtracter 116 and outputs the register output 110 corresponding to the value "10". At this time, the value corresponding to the output signal 111 representing the most significant bit of the register output 110 is "1".

Thereafter, the series of operations described in cycles T1 to T5 is repeated. Thus, the value of the register output 110 of the register 109 is 7, 10, 8, 6, 9, 7, 10, 8, 6, 9, ..., as shown in FIG. 2, and thus repeats an output pattern {7, 10, 8, 6, 9}.

The value of the output signal 111 representing the most significant bit of the register output 110 is 0, 1, 1, 0, 1, 0, 1, 1, 0, 1, ..., as shown in FIG. 2, and thus repeats an output pattern {0, 1, 1, 0, 1}.

As shown in FIG. 2, when the value of the output signal 111 corresponding to the most significant bit of the register output 110 is "1," an output clock 103 is output in the next cycle of the input clock signal 102.

Hence, as shown in FIG. 2, the level of the output clock signal 103 becomes high three times while the level of the input clock signal 102 becomes high five times. That is, accurate ⅗ frequency division can be performed on the clock frequency of the input clock signal 102.

Thus, according to the first embodiment of the present invention, a clock frequency divider circuit can be realized which outputs the output clock N times while the input clock signal 102 is inputted D times. In this case, a minimum interval of a cycle of the output clock is floor(D/N) of the cycle of the input clock signal, and a maximum interval of a cycle of the output clock is ceil(D/N) of the input clock cycle, where floor is a function that returns a maximum integral value not exceeding an argument.

Figure 3:
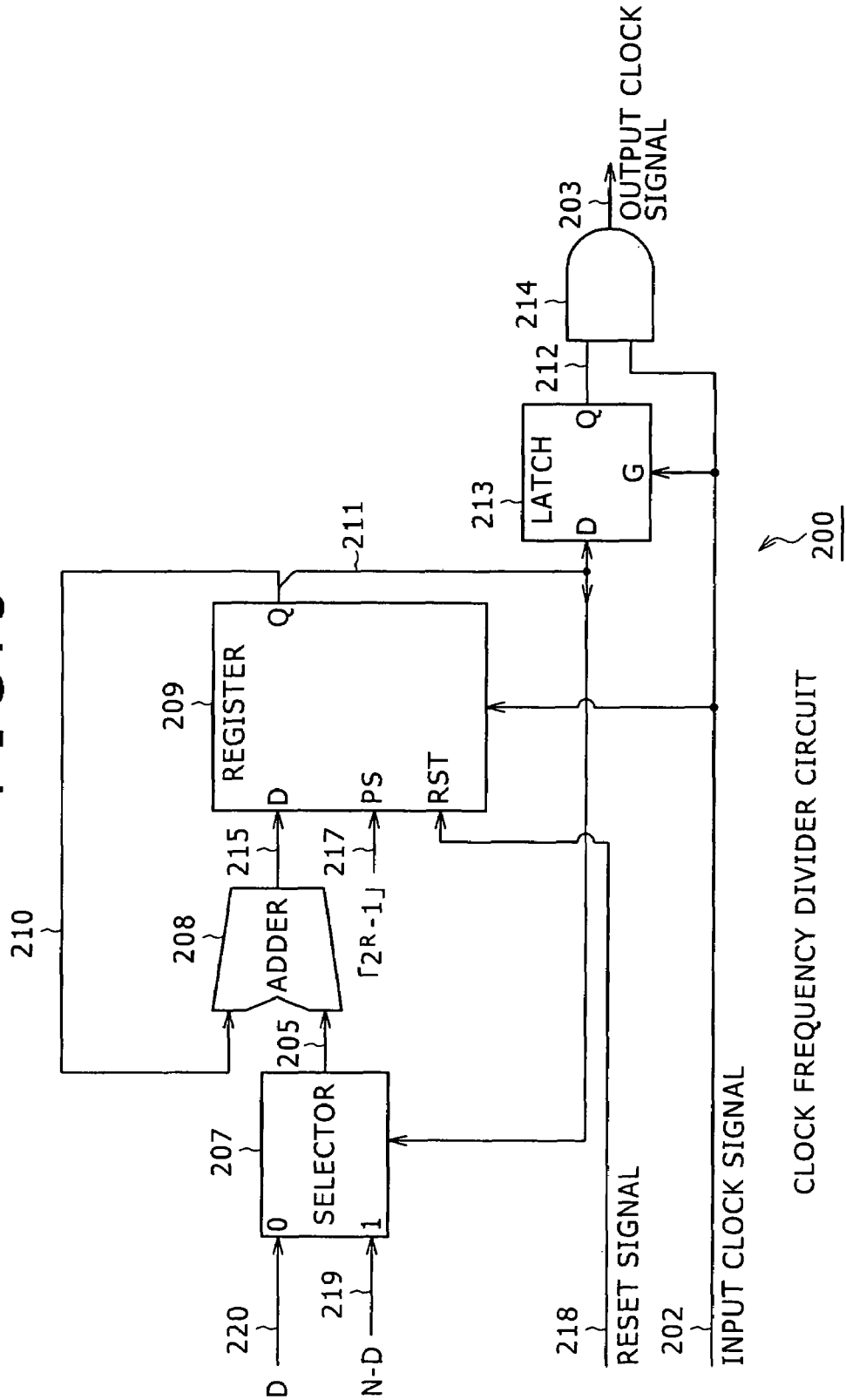
FIG. 3 is a diagram showing an example of a configuration of a clock frequency divider circuit 200 according to a second embodiment of the present invention.

A second embodiment of the present invention will be described next. FIG. 3 is a diagram showing an example of a configuration of a clock frequency divider circuit 200 according to a second embodiment of the present invention. The clock frequency divider circuit 200 according to the second embodiment is formed by removing the subtracter 116 from the clock frequency divider circuit 100 according to the first embodiment.

This clock frequency divider circuit 200 subjects an input clock signal 202 to N/D frequency division. However, it is assumed that the numerator setting value N of a frequency dividing ratio and the denominator setting value D of the frequency dividing ratio are each an arbitrary natural number, and each satisfy a condition (N≦D) and a condition (D!=0).

The clock frequency divider circuit 200 includes a selector 207, an adder 208, a register 209, a latch 213, and a logical product circuit 214.

The selector 207 is supplied with an input signal 220 corresponding to the numerator setting value N of the frequency dividing ratio, an input signal 219 corresponding to a numerator-denominator difference setting value (N−D) that represents a difference between the numerator setting value N and the denominator setting value D of the frequency dividing ratio, and an output signal 211 corresponding to the most significant bit of an output signal (register output) 210 from the register 209. The selector 207 outputs one of the input signal 220 and the input signal 219 as an output signal (selector output) 205 according to the value of the output signal 211.

Specifically, when the value of the output signal 211 representing the most significant bit of the register output 210 is "1", the selector 207 selects the input signal 219 corresponding to the numerator-denominator difference setting value (N−D) representing the difference between the numerator and the denominator of the frequency dividing ratio and outputs the input signal 219 as the selector output 205. On the other hand, when the value of the output signal 211 is "0", the selector 207 selects the input signal 220 corresponding to the numerator setting value N of the frequency dividing ratio and outputs the input signal 220 as the selector output 205.

The adder 208 is supplied with the selector output 205 from the selector 207 and the register output 210 from the register 209. The adder 208 adds a value corresponding to the selector output 205 to a value corresponding to the register output 210 and outputs an output signal 215 corresponding to the result of the addition.

The register 209 is supplied with the output signal 215 from the adder 208, an input signal 217 corresponding to a predetermined initial value "$2^R-1$" (where the variable R represents a value obtained by the above Equation (1)), a reset signal 218, and an input clock signal 202. The register 209 outputs the output signal 210. The most significant bit of the output signal 210 is outputted as the output signal 211.

Specifically, the initial value "$2^R-1$" represented by the input signal 217 is set in the register 209 in response to the reset signal 218. The output signal 215 outputted from the adder 208 is inputted to the register 209 in synchronism with the input clock signal 202. The register 209 stores a result of addition corresponding to the output signal 215.

The latch 213 is supplied with the output signal 211 corresponding to the most significant bit of the register output 210 from the register 209 from a D terminal, and it is supplied with the input clock signal 202 from a G terminal. The latch 213 passes the output signal 211 inputted from the D terminal while the value of the input clock signal 202 is "0".

While the value of the input clock signal 202 is "1", on the other hand, the latch 213 retains the value represented by the output signal 211 inputted from the D terminal and generates and outputs a gate signal (latch output signal) 212 corresponding to the value.

The logical product circuit 214 is supplied with the latch output signal 212 outputted from the latch 213 and the input clock signal 202. The logical product circuit 214 obtains a logical product of the latch output signal 212 and the input clock signal 202 and generates and outputs an output clock signal 203 corresponding to the result.

First, the bit width of each part is set on the basis of the value of the variable R calculated from the above-described Equation (1).

Thus, from the above Equation (1), the adder 208 in FIG. 3 is formed with a bit width of (R+1) bits. The selector 207 is formed with a bit width of (R+1) bits. The register 209 is formed with a bit width of (R+1) bits.

The input signal 220 corresponding to the numerator setting value N of the frequency dividing ratio in FIG. 3 is formed with a bit width of R. The input signal 219 corresponding to the numerator-denominator difference setting value (N−D) representing the difference between the numerator and the denominator of the frequency dividing ratio is formed with a bit width of (R+1) bits. The output signal 215 corresponding to the result of addition of the adder 208 is formed with a bit width of (R+1) bits.

The output signal (selector output) 205 of the selector 207 is formed with a bit width of (R+1) bits. The register output 210 is formed with a bit width of (R+1) bits. The output signal 211 representing the most significant bit of the register output is formed with a bit width of 1 bit.

Figure 4:
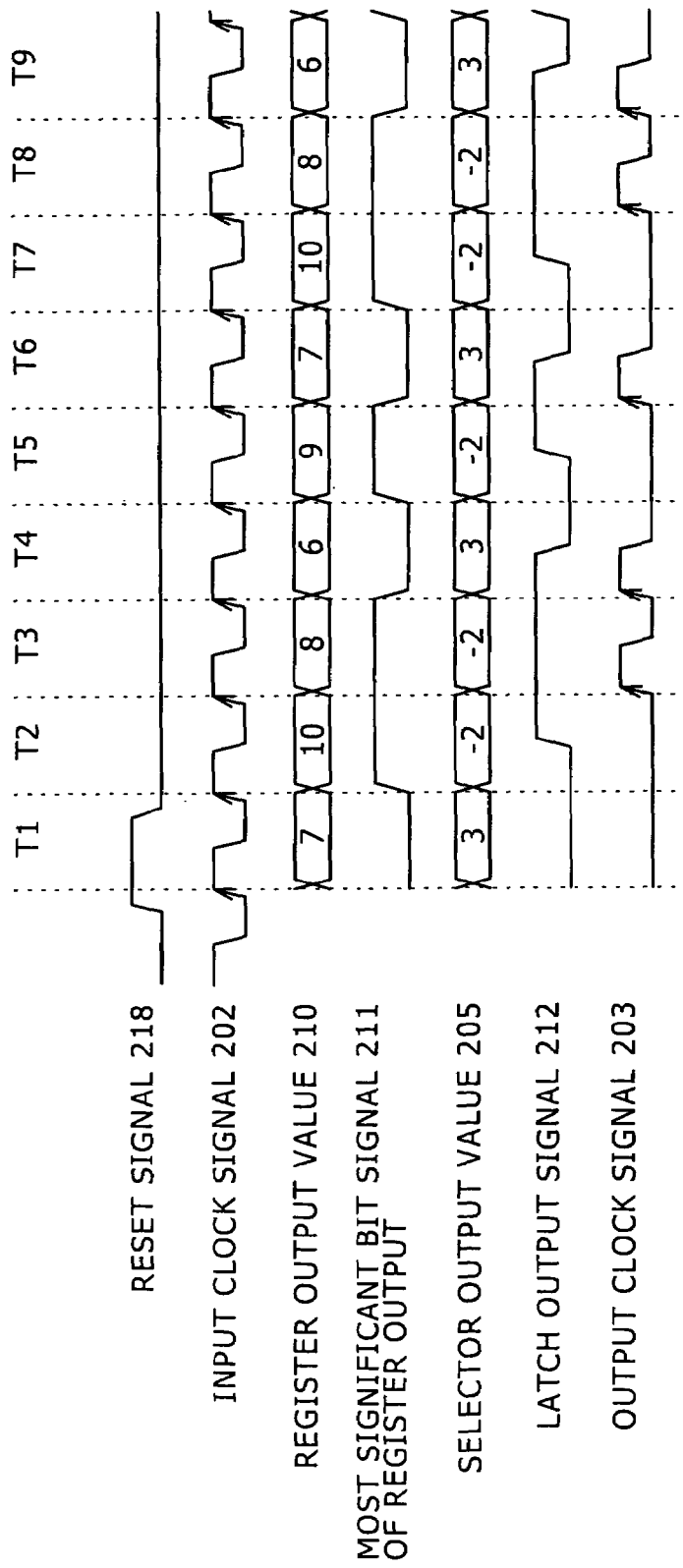
FIG. 4 is a timing chart of an operation of the clock frequency divider circuit 200 according to the second embodiment of the present invention.

The operation of the clock frequency divider circuit 200 according to the second embodiment of the present invention will be described concretely next with reference to FIG. 3 and FIG. 4. FIG. 4 is a timing chart showing an operation when it is assumed that N=3 and D=5, and N/D (=3/5) frequency division is performed in the clock frequency divider circuit 200 of FIG. 3. Suppose in the following that a period from a rising edge of the input clock signal 202 to the next rising edge of the input clock signal 202 is one cycle and that cycles are described as T1, T2, T3, . . . . In this case, from the above Equation (1), R is 3 (=ceil(log(5)/log(2)).

First, when the reset signal 218 is set to a high level, an initial value "7" (=$2^R-1$) is set in the register 209 by the input signal 217. In this case, from the above Equation (1), R is 3.

Next, in a cycle T1 from a rising edge of the input clock signal 202 to the next rising edge of the input clock signal 202, the register 209 outputs the register output 210 corresponding to the initial value "7" (="0111" (binary notation)). At this time, the value corresponding to the output signal 211 representing the most significant bit of the register output 210 is "0".

The output signal 211 is outputted to the data (D) terminal of the latch 213. The latch 213 retains the value "0" of the output signal 211 inputted from the D terminal when the value of the input clock signal 202 is "1", and outputs the latch output signal 212 corresponding to the value "0".

Specifically, the latch 213 captures and retains the value "0" of the output signal 211 when the input clock signal 202 rises and outputs the retained value "0" as the latch output signal 212 while the value of the input clock signal 202 is "1". While the value of the input clock signal 202 is "0", the latch 213 outputs the value "0" of the output signal 211 inputted from the D terminal as it is as the latch output signal 212.

The selector 207 selects the input signal 220 corresponding to the numerator setting value N of the frequency dividing ratio because the value of the output signal 211 representing the most significant bit of the register output 210 is "0" when the input clock signal 202 rises in cycle T1. The selector 207 outputs the input signal 220 as the selector output 205. That is, the selector 207 outputs the selector output 205 corresponding to the value "3" of the input signal 220.

The adder 208 adds the value "7" of the output 210 of the register 209 to the value "3" of the selector output 205 from the selector 207. The adder 208 outputs the output signal 215 representing a value "10" (="1010" (binary notation)) as a result of the addition.

In a next cycle T2, in synchronism with the input clock signal 202, the register 209 stores the value "10" of the output signal 215 representing the result of the addition, which signal is outputted from the adder 208, and outputs the register output 210 corresponding to the value "10." At this time, the value corresponding to the output signal 211 representing the most significant bit of the register output 210 is "1".

The output signal 211 is outputted to the D terminal of the latch 213. Since the value of the output signal 211 when the input clock signal 202 rises in cycle T2 is "0", the latch 213 retains the value "0" of the output signal 211 inputted from the D terminal. The latch 213 outputs the latch output signal 212 corresponding to the value "0" while the value of the input clock signal 202 is "1".

While the value of the input clock signal 202 is "0" in cycle T2, the value of the output signal 211 is "1". Therefore, while the value of the input clock signal 202 is "0", the latch 213 passes the output signal 211, so that the value of the latch output signal 212 is "1".

The selector 207 selects the value "−2" of the input signal 219 representing the numerator-denominator difference setting value (N−D) representing the difference between the numerator and the denominator of the frequency dividing ratio, because the value of the output signal 211 representing the most significant bit of the register output 210 is "1". The selector 207 outputs the selector output 205 corresponding to the value "−2".

The adder 208 adds the value "10" of the register output 210 from the register 209 to the value "−2" corresponding to the selector output 205 outputted from the selector 207. The adder 208 outputs the output signal 215 corresponding to a value "8" ("1000" (binary notation)) as a result of the addition.

In a next cycle T3, in synchronism with the input clock signal 202, the register 209 stores the value "8" of the output signal 215 representing the result of the addition, which signal is outputted from the adder 208, and outputs the register output 210 corresponding to the value "8". At this time, the value corresponding to the output signal 211 representing the most significant bit of the register output 210 is "1".

The output signal 211 is outputted to the D terminal of the latch 213. Since the value of the output signal 211 when the input clock signal 202 rises in cycle T3 is "1", the latch 213 retains the value "1" of the output signal 211 inputted from the D terminal. The latch 213 outputs the latch output signal 212 corresponding to the value "1" while the value of the input clock signal 202 is "1".

While the value of the input clock signal 202 is "0" in cycle T3, the value of the output signal 211 is "1". Therefore, while the value of the input clock signal 202 is "0", the latch 213 passes the output signal 211, so that the value of the latch output signal 212 is "1".

The selector 207 selects the value "−2" of the input signal 219 representing the numerator-denominator difference setting value (N−D) representing the difference between the numerator and the denominator of the frequency dividing ratio because the value of the output signal 211 representing the most significant bit of the register output 210 is "1". The selector 207 outputs the selector output 205 corresponding to the value "−2".

The adder 208 adds the value "8" of the register output 210 from the register 209 to the value "−2" corresponding to the selector output 205 outputted from the selector 207. The adder 208 outputs the output signal 215 corresponding to a value "6" ("0110" (binary notation)) as a result of the addition.

In a next cycle T4, in synchronism with the input clock signal 202, the register 209 stores the value "6" of the output signal 215 representing the result of the addition, which signal is outputted from the adder 208, and outputs the register output 210 corresponding to the value "6". At this time, the value corresponding to the output signal 211 representing the most significant bit of the register output 210 is "0".

The output signal 211 is output to the D terminal of the latch 213. Since the value of the output signal 211 when the input clock signal 202 rises in cycle T4 is "1", the latch 213 retains the value "1" of the output signal 211 input from the D terminal. The latch 213 outputs the latch output signal 212 corresponding to the value "1" while the value of the input clock signal 202 is "1".

While the value of the input clock signal 202 is "0" in cycle T4, the value of the output signal 211 is "0." Therefore while the value of the input clock signal 202 is "0," the latch 213 passes the output signal 211, so that the value of the latch output signal 212 is "0."

The selector 207 selects the value "3" of the input signal 220 representing the numerator setting value N of the frequency dividing ratio because the value of the output signal 211 representing the most significant bit of the register output 210 is "0". The selector 207 outputs the selector output 205 corresponding to the value "3.".

The adder 208 adds the value "6" of the register output 210 from the register 209 to the value "3" corresponding to the selector output 205 outputted from the selector 207. The adder 208 outputs the output signal 215 corresponding to a value "9" ("1001" (binary notation)) as a result of the addition.

In a next cycle T5, in synchronism with the input clock signal 202, the register 209 stores the value "9" of the output signal 215 representing the result of the addition, which signal is outputted from the adder 208, and outputs the register output 210 corresponding to the value "9". At this time, the value corresponding to the output signal 211 representing the most significant bit of the register output 210 is "1".

The output signal 211 is outputted to the D terminal of the latch 213. Since the value of the output signal 211 when the input clock signal 202 rises in cycle T5 is "0", the latch 213 retains the value "0" of the output signal 211 inputted from the D terminal. The latch 213 outputs the latch output signal 212 corresponding to the value "0" while the value of the input clock signal 202 is "1".

While the value of the input clock signal 202 is "0" in cycle T5, the value of the output signal 211 is "1". Therefore, while the value of the input clock signal 202 is "0", the latch 213 passes the output signal 211, so that the value of the latch output signal 212 is "1".

The selector 207 selects the value "−2" of the input signal 219 representing the numerator-denominator difference setting value (N−D) representing the difference between the numerator and the denominator of the frequency dividing ratio, because the value of the output signal 211 representing the most significant bit of the register output 210 is "1". The selector 207 outputs the selector output 205 corresponding to the value "−2".

The adder 208 adds the value "9" of the register output 210 from the register 209 to the value "−2" corresponding to the selector output 205 outputted from the selector 207. The adder 208 outputs the output signal 215 corresponding to a value "7" ("0111" (binary notation)) as a result of the addition.

In a next cycle T6, in synchronism with the input clock signal 202, the register 209 stores the value "7" of the output signal 215 representing the result of the addition, which signal is outputted from the adder 208, and outputs the register output 210 corresponding to the value "7". At this time, the value corresponding to the output signal 211 representing the most significant bit of the register output 210 is "0".

The output signal 211 is outputted to the D terminal of the latch 213. Since the value of the output signal 211 when the input clock signal 202 rises in cycle T6 is "1", the latch 213 retains the value "1" of the output signal 211 inputted from the D terminal. The latch 213 outputs the latch output signal 212 corresponding to the value "1" while the value of the input clock signal 202 is "1".

While the value of the input clock signal 202 is "0" in cycle T6, the value of the output signal 211 is "0". Therefore while the value of the input clock signal 202 is "0", the latch 213 passes the output signal 211, so that the value of the latch output signal 212 is "0".

The selector 207 selects the value "3" of the input signal 220 representing the numerator setting value N of the frequency dividing ratio, because the value of the output signal 211 representing the most significant bit of the register output 210 is "0". The selector 207 outputs the selector output 205 corresponding to the value "3".

The adder 208 adds the value "7" of the register output 210 from the register 209 to the value "3" corresponding to the selector output 205 outputted from the selector 207. The adder 208 outputs the output signal 215 corresponding to a value "10" ("1010" (binary notation)) as a result of the addition.

In a next cycle T7, in synchronism with the input clock signal 202, the register 209 stores the value "10" of the output signal 215 representing the result of the addition, which signal is outputted from the adder 208, and outputs the register output 210 corresponding to the value "10". At this time, the value corresponding to the output signal 211 representing the most significant bit of the register output 210 is "1".

Thereafter, the series of operations described in cycles T1 to T5 is repeated. Thus, the value of the register output 210 of the register 209 is 7, 10, 8, 6, 9, 7, 10, 8, 6, 9, . . . , as shown in FIG. 4, and thus repeats an output pattern {7, 10, 8, 6, 9}.

The value of the output signal 211 representing the most significant bit of the register output 210 is 0, 1, 1, 0, 1, 0, 1, 1, 0, 1, . . . , as shown in FIG. 4, and thus repeats an output pattern {0, 1, 1, 0, 1}.

As shown in FIG. 4, when the value of the output signal 211 corresponding to the most significant bit of the register output 210 is "1", an output clock 203 is outputted in the next cycle of the input clock signal 202.

Hence, as shown in FIG. 4, the level of the output clock signal 203 becomes high three times while the level of the input clock signal 202 becomes high five times. That is, accurate ⅗ frequency division can be performed on the clock frequency of the input clock signal 202.

Thus, the second embodiment of the present invention can also realize a clock frequency divider circuit that outputs the output clock N times while the input clock signal 202 is input D times. In this case, a minimum interval of a cycle of the output clock is floor(D/N) of the cycle of the input clock signal, and a maximum interval of a cycle of the output clock is ceil(D/N) of the input clock cycle, where floor is a function that returns a maximum integral value not exceeding an argument.

In the second embodiment shown in FIG. 3, the numerator-denominator difference setting value (N−D) resulting from subtracting the value of the denominator setting value D of the frequency dividing ratio from the value of the numerator setting value N of the frequency dividing ratio is obtained in advance, and the numerator-denominator difference setting value (N−D) is inputted to the selector 207. It is thereby possible to omit the subtracter 116 that in effect calculates the numerator-denominator difference setting value in the first embodiment shown in FIG. 1. Thus, a device configuration can be simplified.

It is to be noted that while in the embodiments of the present invention a description has been made of a case where D=3 and N=5 and ⅗ frequency division is performed, the frequency of the clock signal can be divided with another arbitrary frequency dividing ratio.

It is to be noted that while the embodiments of the present invention represent an example for embodying the present invention, and each have correspondences with specific inventive items in claims as illustrated in the following, the present invention is not limited to this, and various modifications may be made without departing from the spirit of the present invention.

In claim 1, the storing means corresponds to the register 109, for example. The supplying means corresponds to the selector 107, the adder 108, and the subtracter 116, or the selector 207 and the adder 208, for example. The retaining means corresponds to the latch 113 or the latch 213, for example. The logical product generating means corresponds to the logical product circuit 114 or the logical product circuit 214, for example.

In claim 3, the adding means corresponds to the adder 108, the subtracter 116, and the selector 107, or the adder 208 and the selector 207, for example. The storing means corresponds to the register 109 or the register 209, for example. The retaining means corresponds to the latch 113 or the latch 213, for example. The logical product generating means corresponds to the logical product circuit 114 or the logical product circuit 214, for example.

In claim 5, the subtracter corresponds to the subtracter 116, for example. The register corresponds to the register 109, for example. The selector corresponds to the selector 107, for example. The adder corresponds to the adder 108, for example. The latch corresponds to the latch 113, for example. The logical product circuit corresponds to the logical product circuit 114, for example.

In claim 7, the adder corresponds to the adder 208, for example. The register corresponds to the register 209, for example. The selector corresponds to the selector 207, for example. The latch corresponds to the latch 213, for example. The logical product circuit corresponds to the logical product circuit 214, for example.

As examples of the practical use of the present invention, the present invention is applicable to various circuits and devices that need clock signals of various frequencies, for example.

It should be understood by those skilled in the art that various modifications, combinations, sub-combinations and alterations may occur depending on design requirements and other factors insofar as they are within the scope of the appended claims or the equivalents thereof.

What is claimed is:

1. A clock frequency divider circuit comprising:
   storing means for storing an input signal in synchronism with an input clock signal;
   supplying means for supplying, as said input signal, one of a first value obtained by adding a value stored by said storing means to a numerator setting value and a second value obtained by subtracting a denominator setting value from said first value;
   retaining means for retaining a most significant bit of the value stored by said storing means in synchronism with said input clock signal; and
   logical product generating means for generating a logical product of a value retained by said retaining means and said input clock signal, and outputting the logical product as an output clock signal;
   wherein said supplying means supplies one of said first value and said second value as said input signal on a basis of the most significant bit of the value stored by said storing means.

2. The clock frequency divider circuit as claimed in claim 1,
   wherein an initial value of said storing means is a value obtained by subtracting one from a value obtained by raising two to a power of a number corresponding to a minimum integral value not smaller than a result obtained by dividing a logarithm of said denominator setting value by a logarithm of two.

3. A clock frequency divider circuit for dividing frequency of a predetermined input clock signal with a frequency dividing ratio obtained by dividing a numerator setting value by a denominator setting value, said clock frequency divider circuit comprising:
   adding means for adding a previous result of addition to a difference between said numerator setting value and said denominator setting value, or to said numerator setting value;
   storing means for storing said result of addition by said adding means in synchronism with said input clock signal, and supplying the stored said result of addition as said previous result of addition to said adding means;
   retaining means for retaining a most significant bit of said result of addition stored by said storing means in synchronism with said input clock signal; and
   logical product generating means for generating a logical product of the most significant bit of said result of addition retained by said retaining means and said input clock signal, and outputting the logical product as an output clock signal;
   wherein in an initial stage in which said result of addition is not obtained, said storing means supplies a predetermined initial value as said previous result of addition to said adding means, and
   said adding means selects the difference or said numerator setting value on a basis of a value of the most significant bit of said previous result of addition, adds said previous result of addition to a result of the selection, and supplies a result of the addition to said storing means.

4. The clock frequency divider circuit as claimed in claim 3,
   wherein said initial value is a value obtained by subtracting one from a result obtained by raising two to a power of a number corresponding to a minimum integral value not smaller than a result obtained by dividing a logarithm of said denominator setting value by a logarithm of two.

5. A clock frequency divider circuit for dividing frequency of a predetermined input clock signal with a frequency dividing ratio obtained by dividing a numerator setting value by a denominator setting value, said clock frequency divider circuit comprising:
   a subtracter for performing a predetermined subtraction process;
   a register for storing a first output value from said subtracter in synchronism with said input clock signal, and outputting a second output value corresponding to said first output value in synchronism with said input clock signal;
   a selector for selecting one of said denominator setting value and a value "0" according to a third output value corresponding to a value of a most significant digit when said second output value from said register is represented in binary notation, and outputting a result of the selection as a fourth output value;
   an adder for adding said numerator setting value to said second output value outputted from said register, and outputting a fifth output value corresponding to a result of the addition;
   a latch for retaining said third output value corresponding to the value of said most significant digit of said second output value outputted from said register in synchronism with said clock signal; and
   a logical product circuit for calculating a logical product of a sixth output value outputted from said latch and said clock signal, and outputting a result of the calculation as an output clock signal;

wherein said subtracter subtracts said fourth output value outputted from said selector from said fifth output value outputted from said adder, and outputs said first output value corresponding to a result of the subtraction.

6. The clock frequency divider circuit as claimed in claim 5,
wherein an initial value of said register is a value obtained by subtracting one from a result obtained by raising two to a power of a number corresponding to a minimum integral value not smaller than a result obtained by dividing a logarithm of said denominator setting value by a logarithm of two.

7. A clock frequency divider circuit for dividing frequency of a predetermined input clock signal with a frequency dividing ratio obtained by dividing a numerator setting value by a denominator setting value, said clock frequency divider circuit comprising:
an adder for performing a predetermined addition process;
a register for storing a first output value from said adder in synchronism with said input clock signal, and outputting a second output value corresponding to said first output value in synchronism with said input clock signal;
a selector for selecting one of said numerator setting value and a value corresponding to a result of subtraction of said denominator setting value from said numerator setting value according to a third output value corresponding to a value of a most significant digit when said second output value from said register is represented in binary notation, and outputting a result of the selection as a fourth output value;
a latch for retaining said third output value corresponding to the value of said most significant digit of said second output value outputted from said register in synchronism with said clock signal; and
a logical product circuit for calculating a logical product of a sixth output value outputted from said latch and said clock signal, and outputting a result of the calculation as an output clock signal;
wherein said adder adds said fourth output value outputted from said selector to said second output value outputted from said register, and outputs said first output value corresponding to a result of the addition.

8. The clock frequency divider circuit as claimed in claim 7,
wherein an initial value of said register is a value obtained by subtracting one from a result obtained by raising two to a power of a number corresponding to a minimum integral value not smaller than a result obtained by dividing a logarithm of said denominator setting value by a logarithm of two.

9. A clock frequency divider circuit comprising:
a storer storing an input signal in synchronism with an input clock signal;
a supplier supplying, as said input signal, one of a first value obtained by adding a value stored by said storer to a numerator setting value and a second value obtained by subtracting a denominator setting value from said first value;
a retainer retaining a most significant bit of the value stored by said storer in synchronism with said input clock signal; and
a logical product generator generating a logical product of a value retained by said retainer and said input clock signal, and outputting the logical product as an output clock signal;
wherein said supplier supplies one of said first value and said second value as said input signal on a basis of the most significant bit of the value stored by said storer.

10. A clock frequency divider circuit for dividing frequency of a predetermined input clock signal with a frequency dividing ratio obtained by dividing a numerator setting value by a denominator setting value, said clock frequency divider circuit comprising:
an adder adding a previous result of addition to a difference between said numerator setting value and said denominator setting value, or to said numerator setting value;
a storer storing said result of addition by said adder in synchronism with said input clock signal, and supplying the stored said result of addition as said previous result of addition to said adder;
a retainer retaining a most significant bit of said result of addition stored by said storer in synchronism with said input clock signal; and
a logical product generator generating a logical product of the most significant bit of said result of addition retained by said retainer and said input clock signal, and outputting the logical product as an output clock signal;
wherein in an initial stage in which said result of addition is not obtained, said storer supplies a predetermined initial value as said previous result of addition to said adder, and
said adder selects the difference or said numerator setting value on a basis of a value of the most significant bit of said previous result of addition, adds said previous result of addition to a result of the selection, and supplies a result of the addition to said storer.

* * * * *